(12) United States Patent
Altaf (10) Patent No.: US 12,252,021 B2
(45) Date of Patent: Mar. 18, 2025

(54) METHOD FOR ESTIMATING AN OPERATING PARAMETER OF A BATTERY UNIT

(71) Applicant: VOLVO TRUCK CORPORATION, Gothenburg (SE)

(72) Inventor: Faisal Altaf, Västra Frölunda (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 621 days.

(21) Appl. No.: 17/597,315

(22) PCT Filed: Jul. 3, 2020

(86) PCT No.: PCT/EP2020/068872
§ 371 (c)(1),
(2) Date: Jan. 3, 2022

(87) PCT Pub. No.: WO2021/004961
PCT Pub. Date: Jan. 14, 2021

(65) Prior Publication Data
US 2022/0365139 A1    Nov. 17, 2022

(30) Foreign Application Priority Data
Jul. 5, 2019   (WO) .................. PCT/EP2019/068070

(51) Int. Cl.
*B60L 3/12*     (2006.01)
*G01R 31/367*   (2019.01)
(Continued)

(52) U.S. Cl.
CPC .............. *B60L 3/12* (2013.01); *G01R 31/367* (2019.01); *G01R 31/389* (2019.01); *B60L 50/60* (2019.02);
(Continued)

(58) Field of Classification Search
CPC ....................................................... B60L 3/12
(Continued)

(56) References Cited

U.S. PATENT DOCUMENTS

| 9,321,368 | B2 * | 4/2016 | Yang | ................ | G01R 31/3647 |
| 2015/0231982 | A1 * | 8/2015 | Li | .................... | B60L 3/0069 |
| | | | | | 903/907 |

(Continued)

FOREIGN PATENT DOCUMENTS

| CN | 101501518 A | 8/2009 |
| CN | 105842627 A | 8/2016 |

(Continued)

OTHER PUBLICATIONS

International Search Report and Written Opinion dated Oct. 1, 2020 in corresponding International PCT Application No. PCT/EP2020/068872, 11 pages.

(Continued)

*Primary Examiner* — Jerry D Robbins
(74) *Attorney, Agent, or Firm* — Venable LLP; Jeffri A. Kaminski (57) ABSTRACT

A method for estimating an operating parameter of a battery unit (202) in an energy storage system (200) of a vehicle (201) using a set of first estimators, each first estimator being configured to estimate a state residual size of the battery unit based on a given initial value of said operating parameter and using a prediction model, the operating parameter being indicative of one of capacity and impedance of the battery unit, the method comprising: —obtaining measurement data relating to operating conditions of the energy storage system at a number of points in time $t_k$, —providing a set of initial values of said operating parameter, each initial value being associated with one of said first estimators, —using the set of first estimators, estimating (103) a set of state residual (Continued)

sizes of the battery unit at each point in time $t_k$ based on at least the measurement data and on the associated initial values, —determining a first operating parameter estimate of the battery unit based on the estimated set of state residual sizes, —estimating the operating parameter of the battery unit as a function of time based on at least said first operating parameter estimate, wherein estimating the set of state residual sizes comprises using a recursive algorithm for estimating the state residual size of each element of a set of state residuals, each estimated state residual size being determined based on the state residual size as estimated at a previous point in time $t_{k-1}$ and a current magnitude of the state residual.

20 Claims, 3 Drawing Sheets

(51) Int. Cl.
*G01R 31/389* (2019.01)
*B60L 50/60* (2019.01)
*B60L 58/12* (2019.01)
*B60L 58/16* (2019.01)
*G01R 31/388* (2019.01)
*G01R 31/392* (2019.01)

(52) U.S. Cl.
CPC .............. *B60L 58/12* (2019.02); *B60L 58/16* (2019.02); *B60L 2200/18* (2013.01); *G01R 31/388* (2019.01); *G01R 31/392* (2019.01)

(58) Field of Classification Search
USPC ........................................................ 320/132
See application file for complete search history.

(56) References Cited

U.S. PATENT DOCUMENTS

| | | | |
|---|---|---|---|
| 2022/0247013 A1* | 8/2022 | Wedding | H05K 7/20927 |
| 2022/0314835 A1* | 10/2022 | Altaf | B60L 58/13 |
| 2023/0022486 A1* | 1/2023 | Klintberg | G01R 31/388 |
| 2023/0150396 A1* | 5/2023 | Hooshyar | B60L 50/60 |
| | | | 320/134 |
| 2023/0271529 A1* | 8/2023 | Bryngelsson | B60L 58/13 |
| | | | 701/22 |

FOREIGN PATENT DOCUMENTS

| | | | | | |
|---|---|---|---|---|---|
| CN | 106093796 A | | 11/2016 | | |
| CN | 106443474 A | * | 2/2017 | ........... | G01R 31/007 |
| CN | 107003359 A | * | 8/2017 | ........... | G01R 31/367 |
| CN | 107064811 A | | 8/2017 | | |
| CN | 107438771 A | | 12/2017 | | |
| CN | 109143096 A | | 1/2019 | | |
| CN | 109917292 A | | 6/2019 | | |
| CN | 106980091 B | * | 9/2019 | ........... | G01R 31/388 |
| DE | 102015100043 A1 | | 7/2015 | | |
| JP | 2008199723 A | | 8/2008 | | |

OTHER PUBLICATIONS

International Preliminary Report on Patentablility dated Oct. 11, 2021 in corresponding International PCT Application No. PCT/EP2020/068872, 17 pages.

Chinese Office Action dated Sep. 27, 2024 in corresponding Chinese Patent Application No. 202080048517.1, 14 pages.

* cited by examiner

METHOD FOR ESTIMATING AN OPERATING PARAMETER OF A BATTERY UNIT

CROSS-REFERENCE TO RELATED APPLICATIONS

This application is a U.S. National Stage application of PCT/EP2020/068872, filed Jul. 3, 2020, and published on Jan. 14, 2021, as WO 2021/004961 A1, which is a continuation of PCT/EP2019/068070, filed Jul. 5, 2019, all of which is hereby incorporated by reference in its entirety.

TECHNICAL FIELD

The invention relates to a method for estimating an operating parameter of a battery unit in an energy storage system of a vehicle. The invention further relates to a computer program, a computer readable medium, a control unit, a battery management system, and a vehicle.

The invention can be applied in any type of hybrid vehicles or electrical vehicles, such as partly or fully electrical vehicles. Although the invention will be described with respect to an electrical bus, the invention is not restricted to this particular vehicle, but may also be used in other hybrid or electrical vehicles such as electrical trucks, electrical construction equipment, and electrical cars. The invention may also be applied in any other type of electrical vehicle such as electrical powered construction equipment, electrical working machines e.g. wheel loaders, articulated haulers, dump trucks, excavators and backhoe loaders etc.

BACKGROUND

Batteries are becoming a more common source of power for providing propulsion for vehicles. Such batteries are often rechargeable batteries and typically include a number of battery cells that may be connected in series or in parallel forming a complete battery pack for the vehicle. Typically, a battery pack includes a number of battery cells. The quality of the battery pack is partly dependent on the quality of each battery cell, thereby setting strict requirements on the production quality of the battery cells. However, the battery cells may nevertheless have somewhat different capacities despite the high quality and may also age differently due to e.g. different operating temperature of each battery cell.

In order to determine the state-of-charge (SOC) and provide capacity estimation of a series-cell configured battery pack, data on average value of battery cell voltages and battery pack current may be used. These estimations typically assume that electrochemical characteristics of all battery cells are approximately identical. However, the SOC levels for the battery cells will eventually drift apart leading to an uneven state-of-charge distribution which limits the operational performance for the battery pack. In addition, when there are discrimination among battery cells because of aging and battery cell's different electrochemical characteristics, the variation of average battery cell voltages may not represent each cell's capacity in an accurate manner. Moreover, total capacity of the battery pack assembly is normally limited by the single battery cell having the lowest capacity.

Moreover, the SOC, SOP (state-of-power), and SOE (state-of-energy) levels of the battery are typically estimated using a model of one or several battery cells of the battery pack. A common type of a battery model comprises an equivalent circuit model through which current-voltage characteristics may be obtained for the battery model. Algorithms are used together with the model and typically needs inputs relating to the battery, for example the capacity and impedance of the battery cells of the battery. However, such inputs typically change as the battery ages, which make the estimations more complicated. Furthermore, it is important that the inputs to the algorithms are accurate in order to avoid imprecise estimations of e.g. state of charge.

Further, in hybrid or electrical vehicles, it is often needed to have a sufficiently good knowledge of the battery properties for various operating conditions. Thus, there is an increasing demand for providing an on-board capacity estimation in such vehicles.

By way of example, the capacity of a battery unit can be estimated by a voltage-based estimation method using open circuit voltage and SOC correlation during an idle or operational time of the vehicle. Some examples of possible methods for capacity estimation for battery cells are described in Farmann, A., et al. "Critical review of on-board capacity estimation techniques for lithium-ion batteries in electric and hybrid electric vehicles." Journal of Power Sources 281 (2015): 114-130. However, at least some of the available methods for estimating the capacity of a battery unit require long computation time due to sophisticated algorithms. Furthermore, some of the available methods require a large amount of information storage and thereby require a lot of memory on-board the vehicle. In addition, some methods may give good estimates under certain battery operating scenarios, but not under other, and are therefore not suitable for use under various battery operating scenarios.

Thus, it would be desirable to provide a method for efficient and less memory demanding estimation of an operating parameter such as the capacity of a battery unit. In particular, it would be desirable to provide a method for determining the operating parameter of the battery unit during operation of the vehicle under various conditions.

Definitions

The wording "battery unit" should in the following and throughout the entire description be interpreted to include battery packs, which in themselves may comprise one or more batteries. Still further, the wording "battery unit" should be understood to also include a unit which may comprise a plurality of battery packs. However, the wording "battery unit" may also include a single battery cell. Accordingly, the wording "battery unit" may be a single battery cell, a single battery which may comprise a plurality of battery cells, a battery pack which comprises more than a single battery, as well as a module which comprises more than a single battery pack.

By an "estimator" is in the following and throughout the entire description intended an estimation algorithm or estimation scheme or an observer, i.e. a computer-implemented algorithm for estimating a state or a parameter of a system.

The term "state of charge (SOC)", as used herein, refers to the available capacity at the present status of the battery unit. The SOC may also include or represent the charge level of a battery cell, a single battery unit, a single battery pack, the electrical energy storage system or a combination thereof. The SOC is typically determined in percentage (%) between available capacity and maximum rated capacity of a new battery unit or current maximum usable capacity of a battery unit.

SUMMARY

An object of the invention is to provide an in at least some aspect improved method for estimating an operating parameter, indicative of a capacity or impedance of a battery unit comprised in an energy storage system of an electrically operated vehicle. The object is at least partly achieved by a method according to claim 1.

According to a first aspect of the invention, a method for estimating an operating parameter of a battery unit in an energy storage system of a vehicle using a set of first estimators is provided. Each first estimator is configured to estimate a battery parameter or battery state of the battery unit based on a given initial value of said operating parameter by using a prediction model, and therefrom estimating a state residual size of the battery unit, the state residual size being indicative of a magnitude of an error arising from estimating said battery parameter or battery state using the prediction model. The operating parameter is indicative of one of capacity and impedance of the battery unit. The method comprises:

obtaining measurement data relating to operating conditions of the energy storage system at a number of points in time $t_k$, providing a set of initial values of said operating parameter, each initial value being associated with one of said first estimators, using the set of first estimators, estimating a set of battery parameter or battery state values of the battery unit based on at least the associated initial values of said operating parameter, and therefrom, using the measurement data, estimating a set of state residual sizes associated with the estimated set of battery parameter or battery state values at each point in time $t_k$, determining a first operating parameter estimate of the battery unit based on the estimated set of state residual sizes, estimating the operating parameter of the battery unit as a function of time based on at least said first operating parameter estimate, wherein estimating the set of state residual sizes comprises using a recursive algorithm for estimating the state residual size of each element of a set of state residuals, each estimated state residual size being determined based on the state residual size as estimated at a previous point in time $t_{k-1}$ and a current magnitude of the state residual.

The proposed method uses a recursive algorithm for estimating the size of each state residual in the set of state residuals, which are thereafter used to determine a value of the operating parameter of the battery unit. In short, state residual sizing for each of the first set of estimators is formulated as a dynamic recursion. This is in contrast to methods using batch processing over a certain time period to determine the size of those state residuals. By using a recursive algorithm, the information storage needs may be greatly reduced, thus requiring much less memory provided on-board the vehicle. Furthermore, using a recursive algorithm, it becomes possible to estimate the operating parameter online, i.e. in real time, and not only after a certain time period. The estimated values of the operating parameter may thus be communicated to e.g. other control units of the vehicle either in real time or at certain occasions, such as under certain predetermined operating conditions, or at predetermined time intervals. It may also be selected under which operating conditions or at which time intervals the estimation should be carried out. For example, it may be determined that the estimation is always to be performed during charging of the battery unit.

The proposed method is based on the realization that a more accurate and less memory demanding estimation of the operating parameter value of a battery unit is possible by utilizing a bank of first estimators, e.g. state-of-charge (SOC) estimators, having different initial settings in terms of initial values of the operating parameter to be determined, to recursively estimate the operating parameter to be determined.

The prediction model may be any type of model that is suitable for estimating, i.e. predicting, a battery parameter or battery state value based on a given initial value of said operating parameter, i.e. either capacity or impedance. The prediction model may be an equivalent circuit model, an empirical model, a semi-empirical model, a black-box model, an electrochemical model, etc. The prediction model may be a model that predicts battery voltage as an output, or a model which predicts another battery state or battery parameter, such as temperature.

The battery parameter or battery state may be any battery parameter or battery state that relates to operating conditions of the battery unit and that is possible to measure by means of at least one sensor, such as terminal voltage or temperature. Alternatively, it may be a battery parameter or a battery state that may be derived from the measurement data.

The state residual sizes are herein to be understood as information states describing a magnitude of errors arising from estimating e.g. a battery state, such as state-of-charge, using the prediction model and with the initial values of the operating parameter to be determined and the measurement data as input data. Such a state residual size may also be referred to as a measurement residual size, the state residual thus being understood as the measurement residual. The state residual may however also be understood as a battery state estimation error $r=x-\hat{x}$, wherein r is a vector containing the estimation error in each battery state of the prediction model, wherein x is the true battery state and $\hat{x}$ is the predicted battery state. In this vector, any one, or all, or a subset of the state estimation errors may be included. Although there is generally no access to the true battery state x, the state estimation error is typically constructed internally by the first estimators, such as extended Kalman filters, and can be easily output for further processing. The size of the state estimation error may be determined directly using extended Kalman filters, since this estimator not only computes the state estimation error but also its variance, which can then be directly used as a measure of the state residual size.

The battery may be modelled as an equivalent circuit with a number of RC-circuits, and a set of e.g. five first estimators may be used to estimate the state residual sizes based on different initial values of the operating parameter. The state residual as estimated by each estimator may in this case be related to the difference between an actual measured terminal voltage $V_b$ across the battery unit and a terminal voltage $V_{bi}^*$ as estimated by the respective first estimator, based on the initial value of the operating parameter to be determined. This difference may also be referred to as the voltage error. Alternatively, the state residual as estimated by each estimator may be related to the difference between an actual measured temperature of the battery unit and a temperature as estimated by the respective first estimator, based on the initial value of the operating parameter to be determined. This difference may also be referred to as the temperature error.

Each of the set of first estimators, using the recursive algorithm, may be an estimator that uses e.g. a non-linear observer such as a Kalman filter, e.g. an extended Kalman filter (EKF). Other recursive algorithms that may be used by the estimator include Recursive Least Squares (RLS), Luenberger observers, particle filters, moving horizon estimators, adaptive estimators, sliding mode observers, Lyapunov-based observers, etc. A typical recursive algorithm may be based on an Extended Kalman Filter. EKF uses state-space representation of the prediction model, such as, for example, an equivalent circuit model (ECM) or another prediction model represented on state-space form. Most recursive algorithms including EKF involves two steps, namely i) a State Prediction Step, also known as a Time Update Step, and ii) a State Correction Step, also known as a Measurement Update step. In Step (i), the battery state $\hat{x}^-(k)$ at the current time step is predicted using the prediction model represented on state-space form, and given current/power input data and the estimate of the battery state at a previous time step. In Step (ii), a "corrected state estimate $\hat{x}^+(k)$" is constructed by correcting the predicted state $\hat{x}^-(k)$ based on a measurement residual and a so-called observer/filter gain L(k), or Kalman gain if EKF Is used. The observer gain basically gives information regarding the trustworthiness of the model-based state prediction $\hat{x}^-(k)$ and the measurement residual $\hat{r}^-(k)$, respectively, and then correction is done accordingly. If the prediction model is highly inaccurate, measurements would be judged more trustworthy and larger corrections would be made based on the measurement residual, but if the prediction model is trustworthy, then measurements are less trusted and much smaller corrections are made based on the measurement residual. This observer gain L(k) can be computed using various methods, and this is what primarily makes one recursive algorithm different from other. For example, EKF computes this gain, referred to as the Kalman gain, by using a Bayesian inference approach.

Simple general equations which may be used in most recursive estimation algorithms are shown below:

(i) Battery State Prediction $$\hat{x}^-(k) = A \cdot \hat{x}^+(k-1) + B \cdot u(k-1)$$

(ii) State Correction $$\hat{x}^+(k) = \hat{x}^-(k) + L(k) \cdot \hat{r}^-(k)$$

where:
$\hat{r}^- = V(k) - \hat{V}^-(k)$ is a measurement residual, V(k) being a measured battery voltage and
$\hat{V}^-(k) = V_{oc}(\hat{x}_3^-(k)) + \hat{x}_1^-(k) + \hat{x}_2^-(k) + R_0 \cdot u(k)$ being a predicted battery voltage, where A is a system state matrix, B is a system input matrix, $V_{oc}$ is the open circuit voltage, $x_1$ is the voltage loss across a first RC circuit of the ECM, $x_2$ is the voltage loss across a second RC circuit of the ECM, $x_3$ is the state of charge (SOC), u is the current/power input to the battery unit. The system matrix A and the system input matrix B may be expressed as:

$$A = \begin{bmatrix} a_1 & 0 & 0 \\ 0 & a_2 & 0 \\ 0 & 0 & 1 \end{bmatrix}, \text{ where } a_i = e^{-\frac{\Delta T}{R_i C_i}}$$

$$B = \begin{bmatrix} b_1 \\ b_2 \\ b_3 \end{bmatrix}, \text{ where}$$

$$b_1 = R_1[1 - a_1], b_2 = R_2[1 - a_2], b_3 = \frac{\eta \cdot \Delta T}{3600 \cdot Q}$$

where $\Delta T$ is the sampling time interval, $\eta$ is the battery's Coulombic efficiency, Q is the battery's capacity in Coulombs, and $R_i$ and $C_i$ are the resistance and the capacitance, respectively, of the i:th RC circuit, As explained above, another battery state or battery parameter than voltage may equally be used, such as battery temperature.

The value of the first operating parameter estimate of the battery may be obtained by minimizing the state residual size. In other words, the value of the operating parameter that minimizes the magnitude of errors arising from estimating the battery state over a past time period, or at a current time instant, may be set as the first operating parameter estimate. By way of example, the value of the operating parameter of the battery may be obtained by minimizing the state residual size related to the voltage error. The residual of the voltage error typically corresponds to a battery unit terminal voltage-based residual, i.e. the difference between the cell voltage estimated with each of the set of first estimators, which may be SOC estimators, and the measured voltage.

It is to be noted that the example embodiments and the example advantages as mentioned herein are generally described when the operating parameter refers to the capacity of a battery unit. Accurate capacity estimation allows for an accurate driving range prediction and accurate calculation of a battery's maximum energy storage capability in a vehicle. At the same time, accurate capacity estimation can act as an indicator for battery state-of-health and remaining useful lifetime estimation, at least partly due to the correlation between lifetime and state-of-health and between the capacity of the battery unit and the state-of-health, e.g. decreased capacity of the battery unit with age.

However, it is also likely that the method can be performed when the operating parameter refers to the impedance of the battery unit. Therefore, except mentioned otherwise, the example advantages as mentioned herein are applicable both when the operating parameter refers to the capacity of a battery unit and the impedance of a battery unit.

The example embodiments of the method are particularly useful for estimating the capacity of a battery unit during ordinary operation of an electrical propulsion system of the vehicle. By way of example, the method according to the example embodiments can be used as an integrated part of a battery unit management system. Thus, the capacity of one or more sub-units of the battery unit can be estimated on-board (also referred to as online) of the vehicle and typically during operation of the vehicle.

In other words, the operating parameter may for example be a battery capacity parameter or an impedance, e.g. resistance or capacitance, of the battery unit. According to one example embodiment, the operating parameter may be the capacity of a battery unit. According to another example embodiment, the operating parameter may be the impedance of the battery unit.

In case of estimating the capacity of the battery unit, the term "capacity" refers to a measure, typically in ampere-hours (Ah) of the charge stored by the battery unit. The battery capacity represents the maximum amount of electric charge or energy that can be extracted from the battery unit under certain given conditions. However, the actual energy storage capabilities of the battery unit can vary significantly from the "nominal" rated capacity, as the battery unit capacity depends on the age and past history of the battery, the charging or discharging regimes of the battery and the temperature.

By way of example, the capacity value is a normalized capacity value obtained by a base value such as the nominal battery unit capacity. The capacity value may as well be a dimensionless relative capacity value.

In case of estimating the impedance of the battery unit, the operating parameter may be a parameter of an equivalent circuit model of a battery cell of the battery. For example, such an operating parameter may be an internal resistance $R_0$, or a resistive part $R_i$ or a capacitance $C_i$ of an RC-circuit of the equivalent circuit model.

According to one embodiment, estimating the set of state residual sizes comprises:

based on the associated initial values of the operating parameter, estimating the battery parameter using the prediction model, the estimated battery parameter corresponding to a measured battery parameter comprised in the measurement data, determining said state residual based on a difference between the estimated battery parameter and the measured battery parameter.

With the prediction model being an equivalent circuit model as discussed above, the estimated and measured battery parameter may be a terminal voltage of the battery unit, wherein the set of state residuals and the set of state residual sizes are related to a difference between the estimated terminal voltage and the measured terminal voltage. The battery parameter may also be the temperature, in which case the set of state residual sizes are related to a difference between the estimated temperature and the measured temperature.

According to one embodiment, determining the first operating parameter estimate of the battery unit based on the estimated set of state residual sizes comprises finding the operating parameter estimate that minimizes the state residual size of the associated battery parameter or battery state. Determining the first operating parameter estimate of the battery unit based on the estimated set of state residual sizes may comprise finding the operating parameter estimate that minimizes the state residual size of the associated battery parameter or battery state over a past time period, or at a current time instant. In other words, the value of the operating parameter that minimizes the magnitude of errors arising from estimating the battery state or battery parameter using the prediction model is sought.

According to one embodiment, the method further comprises:

using an observer, filtering of the first operating parameter estimate based on a maximum expected rate of change of said operating parameter.

By filtering based on a maximum expected rate of change, it is possible to remove estimated values that deviate too much from what is expected and thereby obtain a more accurate estimate of the operating parameter. For example, a threshold may be defined for the rate of change, and any value of the first operating parameter estimate resulting in that the threshold is exceeded is removed prior to determining the operating parameter of the battery unit as a function of time. The observer, which may also be referred to as a filter, may e.g. be a non-linear observer such as an extended Kalman filter.

According to one embodiment, the method further comprises:

upon fulfillment of a predefined condition, using at least the first operating parameter estimate to determine an adjusted set of initial values of said operating parameter to be used by the set of first estimators during an upcoming estimation episode, and feeding said adjusted set of initial values to the set of first estimators.

By adjusting the initial values to be used by the set of first estimators during the upcoming estimation episode based on at least the first operating parameter estimate as determined e.g. at an end of a current estimation episode, the set of first estimators become self-tuned and the precision in the determination of the operating parameter is improved over time. The set of adjusted initial values may e.g. be a set of values spread around the first operating parameter estimate. The adjusted set of initial values may also be determined based on a filtered (smoothed) first operating parameter estimate. The adjusted set of initial values may further be determined based on the estimated operating parameter of the battery unit, which may in turn, as will be discussed in the following, be estimated based not only on the first operating parameter estimate, but also on a second operating parameter estimate. In case the estimated operating parameter is mapped to standard operating conditions, the mapped values may be used to determine the adjusted set of initial values.

According to one embodiment, said predefined condition is considered to be fulfilled after a predetermined time period or after an end of a predefined estimation episode. This allows for tuning of the initial values less frequently than at each point in time $t_k$, thereby saving computational power. An estimation episode may herein be understood as a time period whose limits are not predefined in terms of time, but rather in terms of operating conditions of the battery unit or similar, such as in terms of a charging period or a size of a state-of-charge operating window of the battery unit.

According to one embodiment, the method further comprises:

determining a battery state of the battery unit based on said measurement data, using a second estimator, determining a second operating parameter estimate based on said estimated battery state, said second estimator using a different type of algorithm than the set of first estimators, wherein the operating parameter of the battery unit as a function of time is estimated based on the first and the second operating parameter estimates. The second operating parameter estimate is herein to be understood as a second estimate of the same operating parameter as the first operating parameter estimate. E.g., if the operating parameter to be estimated is indicative of the capacity, the first operating parameter estimate is a first estimate of the capacity and the second operating parameter estimate is a second estimate of the capacity.

Thus, for each point in time $t_k$ for which a value of the operating parameter of the battery unit is determined, the operating parameter may be estimated based on any one of the first and the second operating parameter estimates, or estimated based on a weighted combination of those, where weights are determined using levels of uncertainty of the first and second operating parameter estimates and the battery operating conditions. This can for example be achieved through sensor fusion techniques using nonlinear observers, such as extended Kalman filters. The resulting operating parameter as a function of time will be based on both operating parameter estimates. By combining the set of first estimators, using e.g. a non-linear observer such as a Kalman filter, e.g. an extended Kalman filter, with the second estimator that uses another algorithm of a different type, it is possible to mitigate faults or errors likely to arise using only one type of estimator. The second estimator may e.g. use enhanced Coulomb counting, or an optimization based estimation scheme, such as a moving horizon estimation model. Also other optimization based schemes may be used, such as total least squares, recursive-least-squares, and variants of other recursive nonlinear observers, etc. The battery state determined based on measurement data may be the state of charge (SOC) of the battery unit, which may e.g. be more accurately determined based on measurements of the terminal voltage before and after charging of the battery unit, when the battery unit has assumed a relaxed state (i.e., reached the equilibrium). SOC may also be estimated along with the estimate of its variance using nonlinear observers like extended Kalman Filter.

According to one embodiment, the method further comprises:
determining a level of estimation uncertainty of the first and/or the second operating parameter estimate,
wherein estimating the operating parameter of the battery unit as a function of time based on the first and the second operating parameter estimates is performed based on at least a first predefined criterion relating to said level of estimation uncertainty.

Thus, the first and/or the second estimator(s) do not only estimate the operating parameter, e.g. the capacity of the battery unit, but also the estimation uncertainty (i.e. confidence level) of their estimates. In short, the estimators provide the expected value of the operating parameter estimate as well as its variance. This information about estimate uncertainty is herein used to determine which one(s) of the first and the second operating parameter estimates is/are to form the basis when determining a value of the operating parameter at a particular point in time. In this way, the value(s) of the operating parameter may be determined from the operating parameter estimate having the smallest level of uncertainty at the particular point in time.

According to one embodiment, estimating the operating parameter of the battery unit as a function of time based on the first and the second operating parameter estimates is performed based on at least a second predefined criterion relating to an operating condition of the battery unit. This allows selecting the value from the estimator best suited to deliver an accurate operating parameter estimate under the present operating conditions of the battery unit, or the ESS.

According to one embodiment, said second predefined criterion is related to at least an operational state of charge window of the battery unit as determined for a predetermined time period or estimation episode. If it is decided to estimate the operating parameter during charging, the state of charge window (SOC window) is a function of charging current and charging time. For example, for a wide SOC window, the first operating parameter estimate, estimated using first estimators in the form of SOC estimators, may form the basis for estimating the operating parameter, while as for a narrow SOC window, the second operating parameter estimate, estimated using the second estimator, may form the basis for estimating the operating parameter. This approach enables reliable estimation of the operating parameter for both narrow and wide SOC windows.

According to one embodiment, said second predefined criterion is related to at least a degree of relaxation of the battery unit. Relaxation of the battery unit corresponds to a phase after a period of discharge or charge, during which there is no current and the terminal voltage tends towards a steady state. Generally, if the battery unit in a non-relaxed condition, e.g. during charging or discharging, it is preferable to estimate the operating parameter based on the first operating parameter estimate as provided by the first estimators in the form of SOC estimators.

According to one embodiment, the operating parameter is a capacity of the battery unit, and enhanced Coulomb counting, compensating for noise in the measurement data relating to battery current and in the determined battery state, is used to determine said second operating parameter estimate. The enhanced Coulomb counting method improves the standard Coulomb counting method by including compensation for noise (bias and variance) in a current sensor used to measure battery current and in the battery state estimate. The current sensor noise can either be estimated online using nonlinear observer techniques or it can be statistically modelled through lab characterization. Similarly, the error in battery state, such as SOC, can be provided by a nonlinear observer like an enhanced Kalman filter. Enhanced Coulomb counting is particularly suitable for estimating capacity when the battery unit is in a relaxed condition (i.e. the degree of relaxation exceeds a certain threshold). It is also particularly useful when the operational SOC window of the battery unit is relatively narrow (i.e., when the SOC window is lower than a certain threshold), in particular when the SOC window is in a lower range of the total SOC, e.g. when the SOC window is from 20-60% of the total SOC. At wide SOC windows and at higher ranges of the total SOC, the set of first estimators may be used to provide a more accurate capacity estimate.

According to one embodiment, the operating parameter is a capacity of the battery unit, wherein the method further comprises:
iteratively estimating an impedance of the battery unit based on the measurement data, wherein the estimated impedance is fed to the set of first estimators and used in the estimation of the set of state residual sizes of the battery unit.

The estimated impedance is used to compensate for estimation errors arising due to impedance growth or decay over time as the battery unit is ageing. This prevents underestimation or overestimation of the capacity.

According to one embodiment, the method further comprises:
mapping the estimated operating parameter of the battery unit under present operating conditions to that under standard operating conditions.

Short-term variations of the operating parameter, arising due to varying operating conditions, may thereby be isolated from long-term variations arising due to ageing. Look-up tables may be used to map the estimated operating parameter to standard operating conditions. Standard operating conditions are herein to be understood as well-defined operating conditions (for example certain level of temperature and load current) for which characteristics of the battery unit are well-known. A standard load level can be either a given constant load or a zero load current to decouple the impact of operational conditions on the estimate of the operating parameter (for example the capacity) of the battery unit. The choice of standard operating conditions may also be based on nominal battery usage pattern in a given vehicle application. The standard operating conditions may be nominal operating conditions or ideal operating conditions.

According to one embodiment, the method further comprises:
predicting expected operating conditions of the battery unit,
wherein the estimation of the operating parameter is only carried out given that the expected operating conditions fulfill predetermined requirements relating to usage of the battery unit. This approach may be used to save computational power. It may e.g. be determined that the estimation is only to be carried out when it is predicted that the battery unit is to be charged during an upcoming period of time.

According to one embodiment, providing the set of initial values of said operating parameter comprises identifying an expected value of the operating parameter, and providing the set of initial values as a set of values distributed around the expected value. This will contribute to a faster convergence and will thus reduce computing power. For example, the set of initial values may be provided within a predetermined range from the expected value. The set of initial values may include the identified expected value of the operating parameter. The expected value may e.g. be identified by an informed guess, or by using an operating parameter value provided by a manufacturer of the battery unit. The expected value may e.g. be the operating parameter value as specified for the battery unit at the beginning of life of the battery unit, i.e. in a non-aged condition. In addition, information about the battery age may be taken into account to adjust the expected value. The battery manufacturer usually specifies a rated value of the battery capacity and/or battery impedance, which may be used as the expected value. The set of initial values may be spread around this expected value in some predetermined way, or they may be spread randomly around the expected value. For example, if it is known that the battery unit is not new and has already been in service for few years, an expected value of the capacity may be reduced by a certain percentage from its rated value. Nevertheless, the set of initial values of said operating parameter may be spread from a minimum possible value to a maximum possible value to cover an entire possible range. Such a possible range is usually known. After some initial iterations, the set of first estimators will converge close to a true value of the operating parameter, and the spread within the set of initial values may be reduced accordingly.

The set of first estimators may preferably, at each iteration, provide the expected value of the operating parameter as well as its variance, i.e., its uncertainty around the true value.

The set of initial values may in some embodiments be set arbitrarily. Even when staring with arbitrary initial values, each of the first estimators will always move towards the first operating parameter estimate that minimizes the state residual size, i.e., the prediction error magnitude. In short, the estimation algorithm has inherent convergence properties.

The method according to the embodiments can be executed in several different manners. For example, the method may be performed by a control unit during use of the electrical energy storage system by an electrical propulsion system of the vehicle. Typically, the control unit is configured to estimate the operating parameter of the battery unit.

According to a second aspect of the present invention, there is provided a computer program comprising program code means for performing the method of any one of the embodiments of the first aspect when said computer program is run on a computer. Effects and features of the second aspect of the invention are largely analogous to those described above in connection with the first aspect.

According to a third aspect of the present invention, there is provided a computer readable medium carrying a computer program comprising program means for performing the method of any of the embodiments of the first aspect when said program means is run on a computer. Effects and features of the third aspect of the invention are largely analogous to those described above in connection with the first aspect.

According to a fourth aspect of the present invention, there is provided a control unit configured to perform the method according to any one of the embodiments of the first aspect. Effects and features of the fourth aspect of the invention are largely analogous to those described above in connection with the first aspect.

According to a fifth aspect of the present invention, there is provided a battery management system for an energy storage system comprising the control unit according to the fourth aspect. Effects and features of the fifth aspect of the invention are largely analogous to those described above in connection with the first aspect.

According to a sixth aspect of the present invention, there is provided a vehicle, such as a hybrid vehicle or a fully electrified vehicle, comprising an energy storage system and a control unit according to the fourth aspect. Effects and features of the sixth aspect of the invention are largely analogous to those described above in connection with the first aspect.

The vehicle may be an electrical, hybrid, or plug-in hybrid vehicle comprising an electrical motor, wherein the energy storage system provides power to the electrical motor for providing propulsion for the vehicle. It is to be noted that the vehicle can therefore be either a partly or fully electrical vehicle.

Further features of, and advantages with, the present invention will become apparent when studying the appended claims and the following description. The skilled person realizes that different features of the present invention may be combined to create embodiments other than those described in the following, without departing from the scope of the present invention.

BRIEF DESCRIPTION OF THE DRAWINGS

With reference to the appended drawings, below follows a more detailed description of embodiments of the invention cited as examples.

In the drawings.

The drawings are schematic and not necessarily drawn to scale.

DETAILED DESCRIPTION OF EXAMPLE EMBODIMENTS OF THE INVENTION

In the present detailed description, various embodiments of the method according to the present invention are mainly described with reference to an all-electric bus, comprising a propulsion system in the form of battery powered electric motors. However, it should be noted that various embodiments of the described invention are equally applicable for a wide range of hybrid and electric vehicles.

Figure 1:
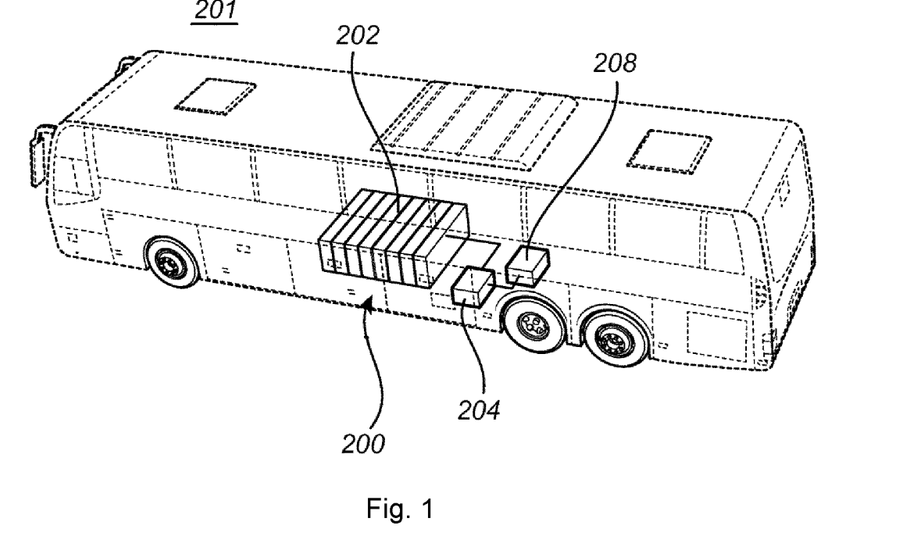
FIG. 1 shows a vehicle in which a method according to the invention may be implemented, FIG. 2 schematically illustrates parts of a battery model describing a battery unit.

FIG. 1 shows a simplified perspective view of an all-electric vehicle in the form of a bus 201, which according to an embodiment is equipped with an electric machine (not shown) for operating the bus.

The bus 201 carries an electric energy storage system (ESS) 200 comprising a battery unit 202 in the form of a battery pack, the battery pack comprising a plurality of battery cells. The battery cells are connected in series to provide an output DC voltage having a desired voltage level. Suitably, the battery cells are of lithium-ion type, but other types may also be used. The number of battery cells per battery pack may be in the range of 50 to 500 cells. It is to be noted that the ESS may include a plurality of battery packs.

A sensor unit (not shown) may be arranged for collecting measurement data relating to operating conditions of the ESS, i.e. measuring temperature, voltage and current level of the associated battery pack 202. Measurement data from each sensor unit is transmitted to an associated battery management unit (BMU) 204, which is configured for managing the individual battery pack 202 during operation of the bus 201. The BMU 204 can also be configured for determining parameters indicating and controlling the condition or capacity of the battery pack 202, such as the state of charge (SOC), the state of health (SOH), the state of power (SOP) and the state of energy (SOE) of the battery pack 202.

The BMU 204 is connected to and configured to communicate with an ESS control unit 208, which controls the ESS. The ESS control unit 208 may include a microprocessor, a microcontroller, a programmable digital signal processor or another programmable device. Thus, the ESS control unit 208 comprises electronic circuits and connections (not shown) as well as processing circuitry (not shown) such that the ESS control unit 208 can communicate with different parts of the bus 201 or with different control units of the bus 201. The ESS control unit 208 may comprise modules in either hardware or software, or partially in hardware or software, and communicate using known transmission buses such a CAN-bus and/or wireless communication capabilities. The processing circuitry may be a general purpose processor or a specific processor. The ESS control unit comprises a non-transitory memory for storing computer program code and data. Thus, the skilled person realizes that the ESS control unit may be embodied by many different constructions. This is also applicable to the BMU 204.

Figure 2:
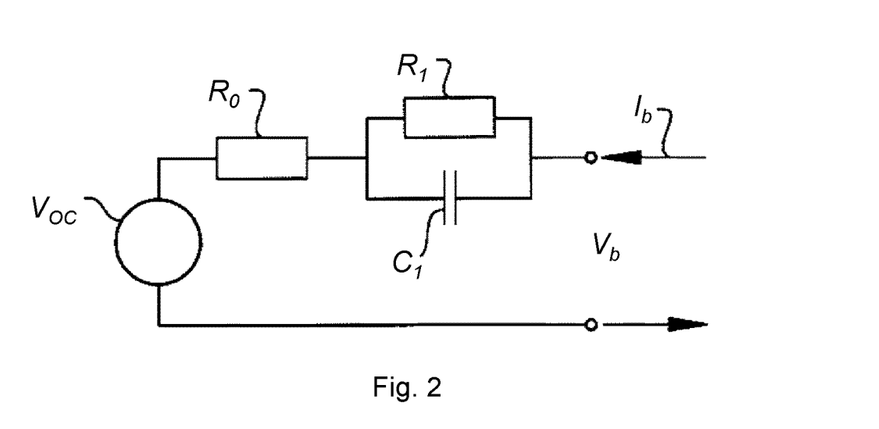

Turning now to FIG. 2, there is depicted a battery model comprising an equivalent circuit of the battery unit 202, also known as a Thevenin battery model. The exemplary equivalent circuit model comprises a single RC circuit to model the battery unit, although more than one RC circuit may be used in the model, such as two RC circuits, depending on battery dynamics and application. The exemplary RC based equivalent circuit model is used for estimation of the state of charge and capacity of the battery unit, and is typically implemented by the above mentioned control unit. The exemplified (equivalent) circuit model illustrated in FIG. 2 is used for estimating the state of charge and capacity of the battery unit based on direct battery measurements. The battery unit state of charge estimation may for example be based on measured battery current inputs and a battery terminal voltage.

The equivalent circuit model described in relation to FIG. 2 consists of an active electrolyte resistance and conductive resistance of electrodes (or internal ohmic resistance) $R_0$, in series with the parallel capacitance $C_1$, and an active charge transfer resistance $R_1$. $V_b$ refers to terminal voltage output, $I_b$ refers to the current in the circuit and $V_{oc}$ refers to the battery open circuit voltage. For given values of the terms $V_{oc}$, $R_0$, $R_1$ and $C_1$, the terminal voltage $V_b$ can be expressed as a function of the current $I_b$. Normally $R_0$ and $R_1$ increases with age, while battery cell capacity (not illustrated in the figure) decreases with age.

By the equivalent circuit model of the battery unit, it becomes possible to determine a state of charge level of a battery unit. As such, it is possible to monitor the state of charge level of a battery unit of the battery system. In this context, it is to be noted that SOC estimation is normally based on voltage and current. One ingredient in a SOC estimator is thus to use the relation between SOC and open circuit voltage $V_{oc}$. Therefore, the SOC of a battery unit is estimated and determined based on the battery unit open circuit voltage $V_{oc}$. Determining battery unit SOC by open circuit voltage is commonly known in the art, and is typically performed by measuring the open circuit voltage of the battery unit. The open circuit voltage of a battery unit is determined by measuring the terminal voltage output $V_b$ of the battery unit when the unit is disconnected from any external load and no external electric current flows through the unit. In the presence of external load (i.e., under non-equilibrium conditions), the open circuit voltage $V_{oc}$ may also be estimated using terminal voltage measurements, current measurements, and estimate of internal dynamic polarization (i.e., voltage drop across the RC circuit(s)). The open circuit voltage $V_{oc}$ is in direct correlation with the SOC of the battery unit.

Figure 3:
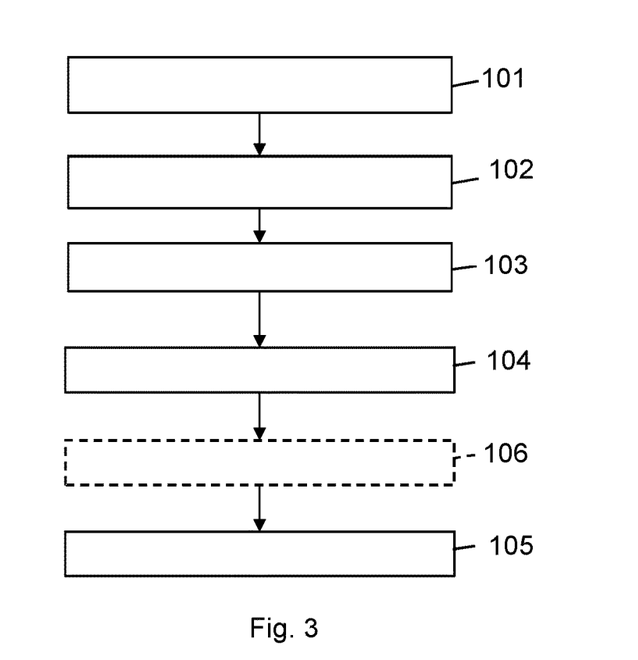
FIG. 3 is a flow-chart illustrating a method according to an embodiment of the invention.
Figure 4:
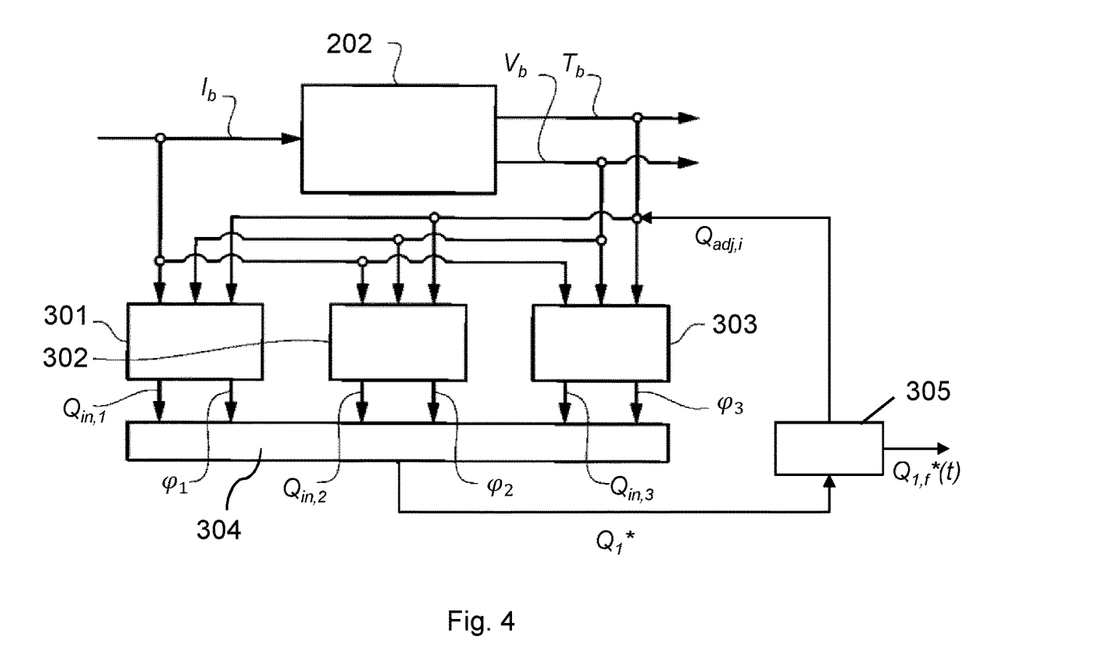
FIG. 4 is a block diagram illustrating steps of a method according to an embodiment of the invention.

A method for estimating an operating parameter of a battery unit such as the one illustrated above according to an embodiment of the invention is schematically illustrated in FIG. 3. Optional steps are marked by dashed lines. In this case, the operating parameter is exemplified by the capacity Q of the battery unit. The steps are carried out repeatedly, such as at a certain time interval, but may not necessarily be carried out in the order shown in FIG. 3. The method steps may in this embodiment be carried out in the ESS control unit 208 or in the BMU 204. Reference is also made to FIG. 4, which is a block model illustrating computational blocks used by a method according to an embodiment of the invention.

In a first step 101, measurement data relating to operating conditions of the energy storage system are obtained, i.e. temperature $T_b$, voltage $V_b$ and current level $I_b$ of the battery pack 202 of the ESS 200. Measurement data are obtained repeatedly at a number of points in time denoted by $t_k$. Sensors may be used for this purpose.

In a second step 102, a set of initial capacity values $Q_{in,i}$ are provided to a set of first estimators. In the shown embodiment, three first estimators 301, 302, 303 are provided. It is however to be noted that a different number of first estimators may be used, such as five first estimators or more. The number of first estimators may be selected depending on application. Each first estimator herein comprises a non-linear observer, such as an extended Kalman filter, configured to estimate a SOC of the battery unit 202 based on an associated one of the initial values $Q_{in,i}=[Q_{in,1}, Q_{in,2}, Q_{in,3}]$ of the capacity, using the equivalent circuit prediction model described above with reference to FIG. 2. Thus, each first estimator is provided with one of said initial values $Q_{in,i}$.

In a third step 103, using the set of first estimators 301, 302, 303, a set of battery parameter or battery state values of the battery unit are estimated based on at least the associated initial values $Q_i$ of said operating parameter, and therefrom, a set of state residuals $r_i$ and state residual sizes $\varphi_i$ of the battery unit 202 at each point in time $t_k$ are estimated, based also on the measurement data relating to operating conditions of the ESS, i.e. relating to the battery parameter or battery state that was estimated. Herein, each first estimator 301, 302, 303 uses its given associated initial value $Q_i$ to estimate the SOC of the battery unit 202 and thereby also determine the state residual $r_i$, i.e. the difference between the actual measured terminal voltage $V_b$ of the battery unit and a terminal voltage estimate $V_{bi}$*, as estimated by the first estimator, $r_i = V_b - V_{bi}$*. This difference may be referred to as the voltage error. The state residual is an indication of how precise the estimation of SOC is and thus how well the initial value $Q_{in,i}$ given to the respective first estimator 301, 302, 303 matches the actual capacity Q of the battery unit 202. The state residual size $\varphi_i$, i.e. the size, i.e., norm, of each state residual, may be expressed as $$\varphi_i \triangleq \|r_i\|_{L2}^2.$$

The state residual size is here expressed as the L2 norm, but also other types of norms and root-mean-square may be used for sizing the state residuals.

A recursive algorithm is used for estimating the set of state residual sizes $\varphi_i$, each estimated state residual size $\varphi_i(k)$ being determined based on, on one hand, the state residual size $\varphi_i(k-1)$ as estimated at a previous point in time $t_{k-1}$, and, on the other hand, on a current magnitude of the state residual $r_i$. The state residual sizes at the point in time $t_{k+1}$ can, using the Euler method, be expressed as:

$$\varphi_i(k+1) = \varphi_i(k) + \Delta t |r_i(k)|^2,$$

wherein $\Delta t$ is the time interval between subsequent samplings and $r_i$ is the current state residual value generated by estimator number i of the first set of estimators, $|r_i(k)|^2$ hence representing a current magnitude of the state residual at the time $t_k$. In the shown embodiment, three state residual sizes $\varphi_1$, $\varphi_2$, $\varphi_3$ are generated by the respective first estimators 301, 302, 303.

In a fourth step 104, a first capacity estimate $Q_1$* of the battery unit is determined based on the estimated set of state residual sizes $\varphi_i$. By way of example, the step of using the set of first estimators 301, 302, 303 to determine the first capacity estimate $Q_1$* of the battery unit based on the estimated set of state residual sizes $\varphi_i$ comprises the step of performing a curve fitting to find a residual function describing the state residual size as a function of capacity. One example of curve fitting is regression analysis. Typically, the curve fitting corresponds to a polynomial fit. One example of suitable polynomial fit is a second order polynomial. Another example of suitable polynomial fit is a fourth order polynomial. In FIG. 4, the fourth step 104 is carried out in block 304.

The step of determining the first capacity estimate $Q_1$* may also comprise performing a convexity check of the residual function. Moreover, the step of determining the first capacity estimate $Q_1$* herein comprises the step of identifying the value of the capacity that minimizes the residual function, e.g. the polynomial. In particular, the first capacity estimate $Q_1$* of the battery unit is determined in block 304, by fitting a curve to the state residual sizes and finding the value of the capacity that corresponds to a minima on the fitted curve.

In a fifth step 105, the capacity Q*(t) of the battery unit 202 is estimated as a function of time based on at least the first capacity estimate $Q_1$*. The capacity Q* of the battery unit 202 may e.g. be determined to be equal to the first capacity estimate $Q_1$* at any given point in time. However, the capacity may also be determined based on additional estimates and using additional method steps, as will be further described below.

The method may e.g. comprise an optional sixth step 106 of filtering the first capacity estimate $Q_1$* based on a priori information relating to a maximum expected rate of change of the capacity of the battery unit to obtain a filtered, or smoothed, first capacity estimate $Q_{1,f}$*(t), based on which the capacity Q*(t) is determined. In this case, a non-linear observer 305, such as an extended Kalman filter, is used for the filtering.

Figure 5:
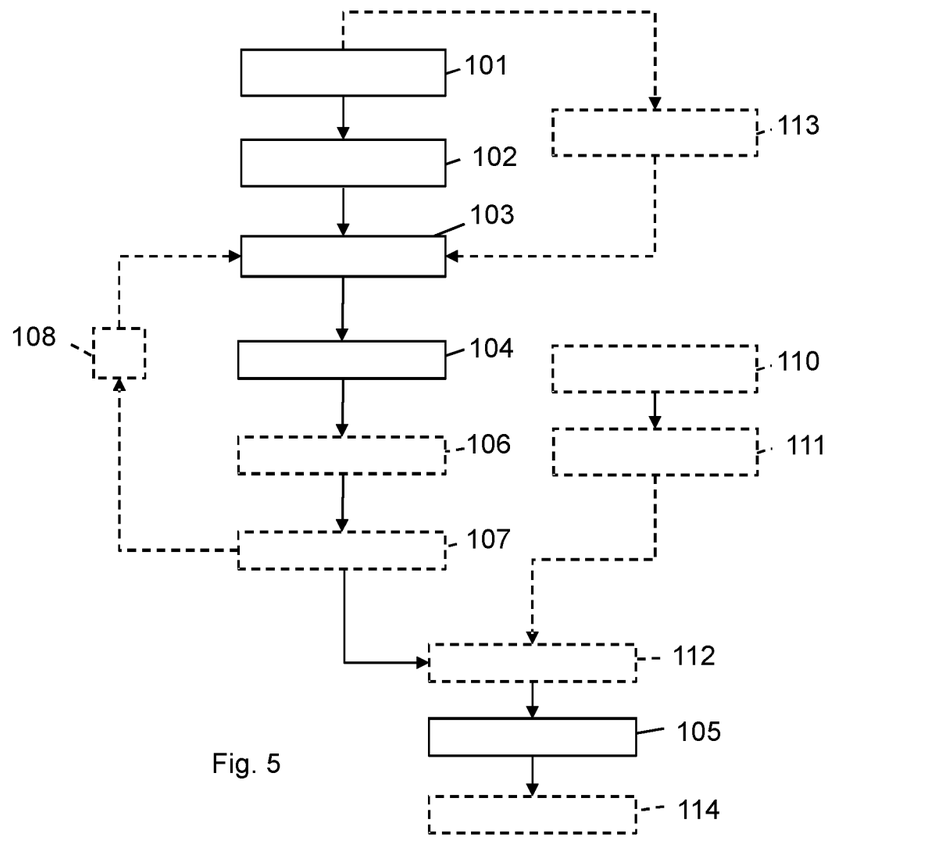
FIG. 5 is a flow-chart illustrating a method according to an embodiment of the invention.
Figure 6:
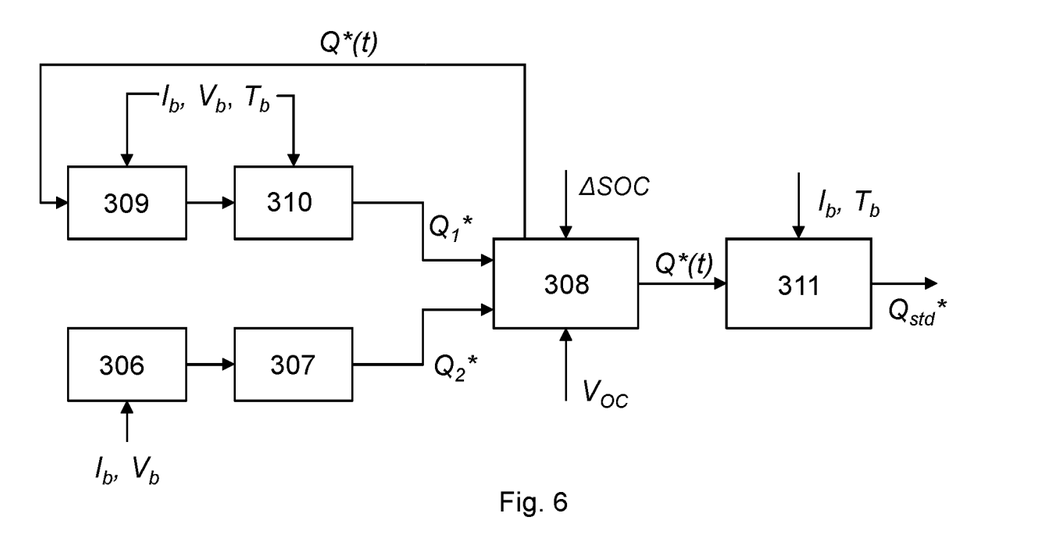
FIG. 6 is a block diagram illustrating steps of a method according to an embodiment of the invention.

Another embodiment of the method is illustrated in FIG. 5, in which optional steps are marked by dashed lines and in which the method steps 101-106 have already been described above with reference to FIG. 3. Reference is also in this case made to FIG. 4, and furthermore to FIG. 6, which is another block model illustrating computational blocks used by the method. In FIG. 6, the first estimators 301, 302, 303 and the subsequent block 304 are illustrated by a combined block 310.

In this embodiment, the method comprises a step 107 of determining an adjusted set of initial capacity values $Q_{adj,i}$ based on the first capacity estimate $Q_1$*, given that a predefined condition is fulfilled. The predefined condition may e.g. be considered to be fulfilled after a predetermined time period or after an end of a predefined estimation episode. In the shown embodiment, the adjusted set of initial capacity values $Q_{adj,i}$ are determined based on the filtered (smoothed) first capacity estimate $Q_{1,f}$* determined using the non-linear observer 305. The adjusted set of initial capacity values $Q_{adj,i}$ may typically be spread around the filtered first capacity estimate $Q_{1,f}$*. In a step 108, the adjusted set of initial capacity values $Q_{adj,i}$ are fed back to the set of first estimators 301, 302, 303, where they are used for estimation of a new set of state residuals sizes $\varphi_i$ during an upcoming estimation episode.

The method illustrated in FIG. 5 and FIG. 6 further comprises a step 110 of determining a battery state, such as SOC, of the battery unit 202, based on the measurement data relating to battery current $I_b$ and battery terminal voltage $V_b$. The battery state may either be measured under certain circumstances, or be estimated based on measurement data using a SOC estimator 306 as illustrated in FIG. 6. The battery state, in this case SOC, is in a subsequent step 111 used for determining a second capacity estimate $Q_2$* based on the determined SOC and on the measured current I. In step 111, a second estimator 307 is used for the estimation of determining the second capacity estimate $Q_2$*, wherein the second estimator 307 uses another algorithm than the set of first estimators 301, 302, 303. For example, the second estimator 307 may use enhanced Coulomb counting, in which the capacity estimate $Q_2$* is calculated from measured battery current and from the SOC of the battery unit 202 as determined by the SOC estimator 306, compensating for random errors and bias in measured current and estimated SOC. The first and second capacity estimates $Q_1$*, $Q_2$* are fed to a fusion block 308, in which an optimum weighted average of the capacity Q*(t) is estimated based on those estimates.

When on one hand the set of first estimators 301, 302, 303 are used to determine a first capacity estimate $Q_1$* and on the other hand the second estimator 307 is used to determine the second capacity estimate $Q_2$*, the capacity Q*(t) of the battery unit as a function of time may in the step 105, in the fusion block 308, be estimated based on the first and the second capacity estimates $Q_1$*, $Q_2$*. How to select which of the capacity estimates $Q_1$*, $Q_2$* to base the capacity Q* of the battery unit on at any given point in time may be determined as described in the following.

For example, a step 112 of determining a level of uncertainty of the first and/or the second capacity estimate $Q_1^*$, $Q_2^*$ may be carried out. A level of uncertainty of the first capacity estimate $Q_1^*$ may be determined from the convexity, or slope, of the residual function. The smaller the convexity, i.e. the flatter the curve, the larger is the level of uncertainty in the estimate. A level of uncertainty of the second estimate $Q_2^*$ may be determined based on a variance of the SOC value used for calculating the second estimate $Q_2^*$. The capacity $Q^*(t)$ of the battery unit is determined from one of the capacity estimates $Q_1^*$, $Q_2^*$, wherein the value to be used is selected based on a first predefined criterion relating to said level of uncertainty. For example, a threshold may be set relating to an acceptable level of uncertainty. Also a second criterion may be predefined, relating to an operating condition of the battery unit. For example, the second predefined criterion may be related to an operational SOC window $\Delta SOC$ of the battery unit 202, as determined for a predetermined time period or estimation episode. The second predefined criterion may also be related to a degree of relaxation of the battery unit 202, wherein the open circuit voltage $V_{oc}$ is used as input to the fusion block 308. Both the first and the second criteria may be taken into account for the estimation of the capacity $Q^*(t)$.

Generally, when the second estimator 307 uses enhanced Coulomb counting, the second estimator 307 is particularly suitable for estimating capacity when the battery unit 202 is in a relaxed condition at the start and end of a charge or discharge process. It is also particularly useful when the operational SOC window $\Delta SOC$ of the battery unit is relatively narrow, in particular when the SOC window is in a lower range of the total SOC, e.g. when the SOC window is from 20-60% of the total SOC. At wide SOC windows and at higher ranges of the total SOC, the set of first estimators 301, 302, 303 may be used to provide a more accurate capacity estimate. If the SOC window is wide, regardless of whether the battery unit is in a relaxed condition or not, using output from the set of first estimators 301, 302, 303 is generally preferable over using output from the second estimator 307, mainly due to a higher likelihood of large error accumulation during open-loop Coulomb counting over a wide SOC window for biased current sensing. However, if the current sensor used to measure battery current is known to have insignificant current bias, output from the second estimator 307 may also be used. In short, the choice depends on operating conditions and on the level of uncertainty.

The method as illustrated in FIG. 5 further comprises a step 113 of iteratively estimating an impedance R of the battery unit 202 based on the measurement data using an impedance estimator 309. The estimated impedance is fed to the set of first estimators 301, 302, 303 and used in the estimation of the set of state residual sizes $\varphi_i$ of the battery unit to compensate for estimation errors arising due to impedance growth. The impedance estimator 309 may also use the estimated capacity $Q^*(t)$ from the fusion block 308 as an input.

The method as illustrated in FIG. 5 further comprises a step 114 of mapping the estimated capacity $Q^*(t)$ of the battery unit under present operating conditions to the capacity $Q_{std}^*(t)$ under standard operating conditions in order to isolate operating-condition-dependent short-term capacity variation from long-term variation due to ageing. This may e.g. be performed in a mapping block 311 using look-up tables and average or root-mean-squared values of measured current $I_b$ and temperature $T_b$ over the estimation episode. The estimated capacity mapped to standard conditions $Q_{std}^*(t)$ may also be fed to the impedance estimator 309 mentioned above to be used as input in the impedance estimation.

The method may also comprise a step (not shown) of predicting expected operating conditions of the battery unit 202, and performing the estimation of the capacity $Q^*(t)$ only given that the expected operating conditions fulfill predetermined requirements relating to usage of the battery unit 202. For example, it may be determined that the method can estimate the capacity of the battery unit only when the operating condition is within a given operating condition range.

Although the figures may show a sequence, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps. Additionally, even though the invention has been described with reference to specific exemplifying embodiments thereof, many different alterations, modifications and the like will become apparent for those skilled in the art.

The estimated battery operating parameter may e.g. be communicated to an electronic control unit of the vehicle, such as an engine control unit (ECU). The estimated operating parameter may be communicated at time intervals depending on e.g. operating conditions of the ESS, or in real time.

The control functionality of the example embodiments may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

It is to be understood that the present invention is not limited to the embodiments described above and illustrated in the drawings; rather, the skilled person will recognize that many changes and modifications may be made within the scope of the appended claims. For example, although the present invention has mainly been described in relation to an electrical bus, the invention should be understood to be equally applicable for any type of electric vehicle, in particular an electric truck or the like.

The invention claimed is:

1. A method for estimating an operating parameter of a battery unit in an energy storage system of a vehicle using a set of first estimators, each first estimator being configured to:
   estimate a battery parameter or battery state of the battery unit based on a given initial value of said operating parameter by using a prediction model, the battery parameter or battery state relating to operating conditions of the battery unit, the prediction model being a model suitable for predicting a battery parameter or battery state value based on the given initial value of said operating parameter, and
   from the estimated battery parameter or battery state, estimating a state residual size of the battery unit, the state residual size being indicative of a magnitude of an error arising from estimating said battery parameter or battery state using the prediction model,
the operating parameter being indicative of one of capacity and impedance of the battery unit, the method comprising:
   obtaining measurement data relating to operating conditions of the energy storage system at a number of points in time $t_k$,
   providing to the set of first estimators a set of initial values of said operating parameter, each initial value being associated with one of said first estimators,
   using the set of first estimators, estimating a set of battery parameter or battery state values of the battery unit based on at least the associated initial values of said operating parameter, and
   from the estimated set of battery parameter or battery state values, using the measurement data relating to the battery parameter or battery state that was estimated and the set of first estimators, estimating a set of state residual sizes associated with the estimated set of battery parameter or battery state values at each point in time $t_k$, wherein estimating the set of state residual sizes comprises using a recursive algorithm for estimating the state residual size of each element of a set of state residuals, each estimated state residual size being determined based on the state residual size as estimated at a previous point in time $t_{k-1}$ and a current magnitude of the state residual,
   determining a first operating parameter estimate of the battery unit based on the estimated set of state residual sizes by finding the operating parameter estimate that minimizes the state residual size of the associated battery parameter or battery state,
   estimating the operating parameter of the battery unit as a function of time based on at least said first operating parameter estimate.

2. The method according to claim 1, wherein estimating the set of state residual sizes comprises:
   based on the associated initial values of the operating parameter, estimating the battery parameter using the prediction model, the estimated battery parameter corresponding to a measured battery parameter comprised in the measurement data,
   determining said state residual based on a difference between the estimated battery parameter and the measured battery parameter.

3. The method according to claim 1, further comprising:
   using an observer, filtering the first operating parameter estimate based on a maximum expected rate of change of said operating parameter.

4. The method according to claim 1, further comprising:
   upon fulfillment of a predefined condition, using at least the first operating parameter estimate to determine an adjusted set of initial values of said operating parameter to be used by the set of first estimators during an upcoming estimation episode, and
   feeding said adjusted set of initial values to the set of first estimators.

5. The method according to claim 4, wherein said predefined condition is considered to be fulfilled after a predetermined time period or after an end of a predefined estimation episode.

6. The method according to claim 1, further comprising:
   determining a battery state of the battery unit based on said measurement data,
   using a second estimator, determining a second operating parameter estimate based on said estimated battery state, said second estimator using a different type of algorithm than the set of first estimators,
wherein the operating parameter of the battery unit as a function of time is estimated based on the first and the second operating parameter estimates.

7. The method according to claim 6, further comprising:
   determining a level of uncertainty of the first and/or the second operating parameter estimate,
wherein estimating the operating parameter of the battery unit as a function of time based on the first and the second operating parameter estimates is performed based on at least a first predefined criterion relating to said level of uncertainty.

8. The method according to claim 6, wherein estimating the operating parameter of the battery unit as a function of time based on the first and the second operating parameter estimates is performed based on at least a second predefined criterion relating to an operating condition of the battery unit.

9. The method according to claim 8, wherein said second predefined criterion is related to at least an operational state of charge window of the battery unit as determined for a predetermined time period or estimation episode.

10. The method according to claim 8, wherein said second predefined criterion is related to at least a degree of relaxation of the battery unit.

11. The method according to claim 6, wherein the operating parameter is a capacity of the battery unit, and wherein enhanced Coulomb counting, compensating for noise in the measurement data relating to battery current and in the determined battery state, is used to determine said second operating parameter estimate.

12. The method according to claim 1, wherein the operating parameter is a capacity of the battery unit, the method further comprising:
   iteratively estimating an impedance of the battery unit based on the measurement data, wherein the estimated impedance is fed to the set of first estimators and used in the estimation of the set of state residual sizes of the battery unit.

13. The method according to claim 1, further comprising:
mapping the estimated operating parameter of the battery unit under present operating conditions to that under standard operating conditions.

14. The method according to claim 1, further comprising:
predicting expected operating conditions of the battery unit,
wherein the estimation of the operating parameter is only carried out given that the expected operating conditions fulfill predetermined requirements relating to usage of the battery unit.

15. The method according to claim 1, wherein providing the set of initial values of said operating parameter comprises identifying an expected value of the operating parameter, and providing the set of initial values as a set of values distributed around the expected value.

16. A computer program comprising program code means for performing the method according to claim 1 when said computer program is run on a computer.

17. A computer readable medium carrying a computer program comprising program means for performing the method according to claim 1 when said program means is run on a computer.

18. A control unit configured to perform the method according to claim 1.

19. A battery management system for an energy storage system comprising the control unit according to claim 18.

20. A vehicle, such as a hybrid vehicle of a fully electrified vehicle, comprising an energy storage system and a control unit according to claim 18.

* * * * *